(12) United States Patent
Aoki et al.

(10) Patent No.: US 8,345,893 B2
(45) Date of Patent: Jan. 1, 2013

(54) SOUND VOLUME CONTROLLER

(75) Inventors: Ryotaro Aoki, Hamamatsu (JP); Hitoshi Akiyama, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1126 days.

(21) Appl. No.: 12/134,555

(22) Filed: Jun. 6, 2008

(65) Prior Publication Data

US 2009/0016547 A1   Jan. 15, 2009

(30) Foreign Application Priority Data

Jun. 6, 2007   (JP) .................................. 2007-150265

(51) Int. Cl.
    *H03G 3/00*   (2006.01)
(52) U.S. Cl. .......................... 381/109; 381/106; 381/104
(58) Field of Classification Search .......... 381/104–109, 381/102, 56, 58
    See application file for complete search history.

(56) References Cited

U.S. PATENT DOCUMENTS

| | | | |
|---|---|---|---|
| 5,396,562 A | 3/1995 | Ishimitsu et al. | |
| 7,583,809 B2 * | 9/2009 | Okimoto et al. | 381/104 |
| 2002/0076072 A1 * | 6/2002 | Cornelisse | 381/312 |
| 2004/0008851 A1 * | 1/2004 | Hagiwara | 381/104 |
| 2006/0018493 A1 * | 1/2006 | Oh et al. | 381/107 |

FOREIGN PATENT DOCUMENTS

| | | |
|---|---|---|
| JP | 5-75367 A | 3/1993 |
| JP | 2002-353758 A | 12/2002 |
| JP | 2005-229544 A | 8/2005 |
| JP | 2006-42027 A | 2/2006 |

OTHER PUBLICATIONS

English translation of Japanese Office Action dated Dec. 10, 2009 (Fourteen (14) pages).

* cited by examiner

*Primary Examiner* — Disler Paul
(74) *Attorney, Agent, or Firm* — Crowell & Moring LLP

(57) ABSTRACT

A sound volume controller includes a level adjustment section that adjusts a level of an input audio signal and outputs the adjusted input audio signal as an output audio signal, a level detection section that detects the level of the input audio signal, a volume value detection section that detects a volume value set by a user, a coefficient table storage section that stores a coefficient table which describes a relation between levels of the output audio signal and levels of the input audio signal, a coefficient table change section that changes the coefficient table stored in the coefficient table storage section in accordance with the volume value detected by the volume value detection section, and a setting section that sets an amount of level adjustment of the level adjustment section in accordance with the level of the input audio signal detected by the level detection section and the coefficient table.

5 Claims, 7 Drawing Sheets

SOUND VOLUME CONTROLLER

BACKGROUND

The present invention relates to a sound volume controller that controls a volume of an audio signal.

When a movie, music, or the like, is played back in the night time, a sound volume (loudnes level of sound) of the audio apparatus is generally set to be low. However, turning down of volume naturally makes a playback of sound hard to hear. In particular, when a movie is played back, turning down of volume makes it difficult to hear a small sound especially, such as words (speech), because the range of volume (a dynamic range) for the movie is wide. In the meantime, when the volume is totally turned up in order to make it easy to catch the words, sound effects and the like, are played back at a high volume level.

In order to solve the problem, there is proposed a sound volume controller that compresses a dynamic range on a per-channel basis; that turns up the volume of words, and the like, to thus make it easy to hear and plays back sound effects, and the like, in a suppressed manner (see; for instance, Patent Document 1).

[Patent Document 1] JP-A-2006-42027

However, according to the configuration of the controller described in Patent Document 1, a coefficient of dynamic range compression is constant at all times. Therefore, depending on a viewing environment there still exists a case where a sound is felt as being too loud or small. In this case, there still exists a necessity for the user to adjust a volume control each time. When dynamic range compression is once set to an active position, a dynamic range is always compressed even in a viewing environment that does not require dynamic range compression as in the daytime, unless the user manually deactivates dynamic range compression.

SUMMARY

Accordingly, the present invention aims at providing a sound volume controller that enables real-time dynamic range compression reflecting a user's viewing environment.

In order to achieve the above object, according to the present invention, there is provided a sound volume controller, comprising:

a level adjustment section that adjusts a level of an input audio signal and outputs the adjusted input audio signal as an output audio signal;

a level detection section that detects the level of the input audio signal;

a volume value detection section that detects a volume value set by a user;

a coefficient table storage section that stores a coefficient table which describes a relation between levels of the output audio signal and levels of the input audio signal;

a coefficient table change section that changes the coefficient table stored in the coefficient table storage section in accordance with the volume value detected by the volume value detection section; and a setting section that sets an amount of level adjustment of the level adjustment section in accordance with the level of the input audio signal detected by the level detection section and the coefficient table.

In this configuration, the coefficient of dynamic range compression is changed in accordance with a volume value set by the user. For instance, when the sound volume value is set to be high by the user, performance of dynamic range compression is determined not to be required or such compression is determined to be low. Dynamic range compression is set such that a characteristic identical with or close to a linear characteristic is achieved. In the meantime, when the sound volume value is made small, an increase in dynamic range compression is determined to be required, and turning up of a small volume and turning down of a large volume are performed. Further, when the sound volume value is made much smaller, only a small volume may be turned up, but sound of a large volume may not be turn down.

Preferably, the sound volume controller further comprising:

a volume shift section that adjusts a level of the output audio signal output from the level adjustment section; and a volume shift control section that sets volume shift level of the volume shift section in accordance with the volume value detected by the volume value detection section.

In the configuration, the audio signal undergone dynamic range compression is subjected to a volume shift. For instance, the audio signal is subjected to an adjustment of; for example, 10 dB or thereabouts (a volume is slightly turned up). When the volume value is turned down, the volume is slightly adjusted, to thus eliminate an uncomfortable auditory feeling.

Preferably, the input audio signal is formed from signals of a plurality of channels. The level adjustment section adjusts respective levels of the signals of the plurality of channels. The level detection section detects the respective levels of the signals of the plurality of channels. The setting section sets amounts of level adjustment of the channels respectively in accordance with the respective levels of the signals of the plurality of channels.

In this configuration, dynamic range compression is performed on a per-channel basis. For instance, a channel including sound, such as words, a channel including sound, such as sound effects, and a channel including only a quiet voice are subjected to dynamic range compression by means of different lines. As a result, sound, such as words, can be clear heard without being not lost in sound effects, and the like.

Preferably, the level detection section detects a level of an input audio signal of a channel having the maximum level among the signals except a signal of a specific channel. The setting section sets amounts of level adjustment for the channels except the specific channel in accordance with the level of the input audio signal having the maximum level.

In this configuration, audio signals except an audio signal of a specific channel (e.g., a channel including a voice, such as words) are collectively subjected to dynamic range compression while the level of an audio signal of a channel having the maximum level is taken as a reference. Lines except a specific channel are collectively subjected, as different lines, to dynamic range compression in accordance with the maximum level, and hence processing load is diminished, and sound of the specific channel is prevented from being lost.

Here, it is preferable that, the signals except the signal of the specific channel are an audio signal of an L channel, an audio signal of an R channel, an audio signal of an LS channel, and an audio signal of an RS channel.

According to the present invention, a coefficient of dynamic range compression is set in accordance with a volume level set by the user. Hence, dynamic range compression reflecting the users viewing environment can be set in real time.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

A sound volume controller of an embodiment of the present invention will be described. The sound volume controller of this embodiment relates to a so-called AV amplifier that receives, as an input, an audio signal output from a DVD player, or the like, and that produces an output after amplifying the signal.

Figure 1:
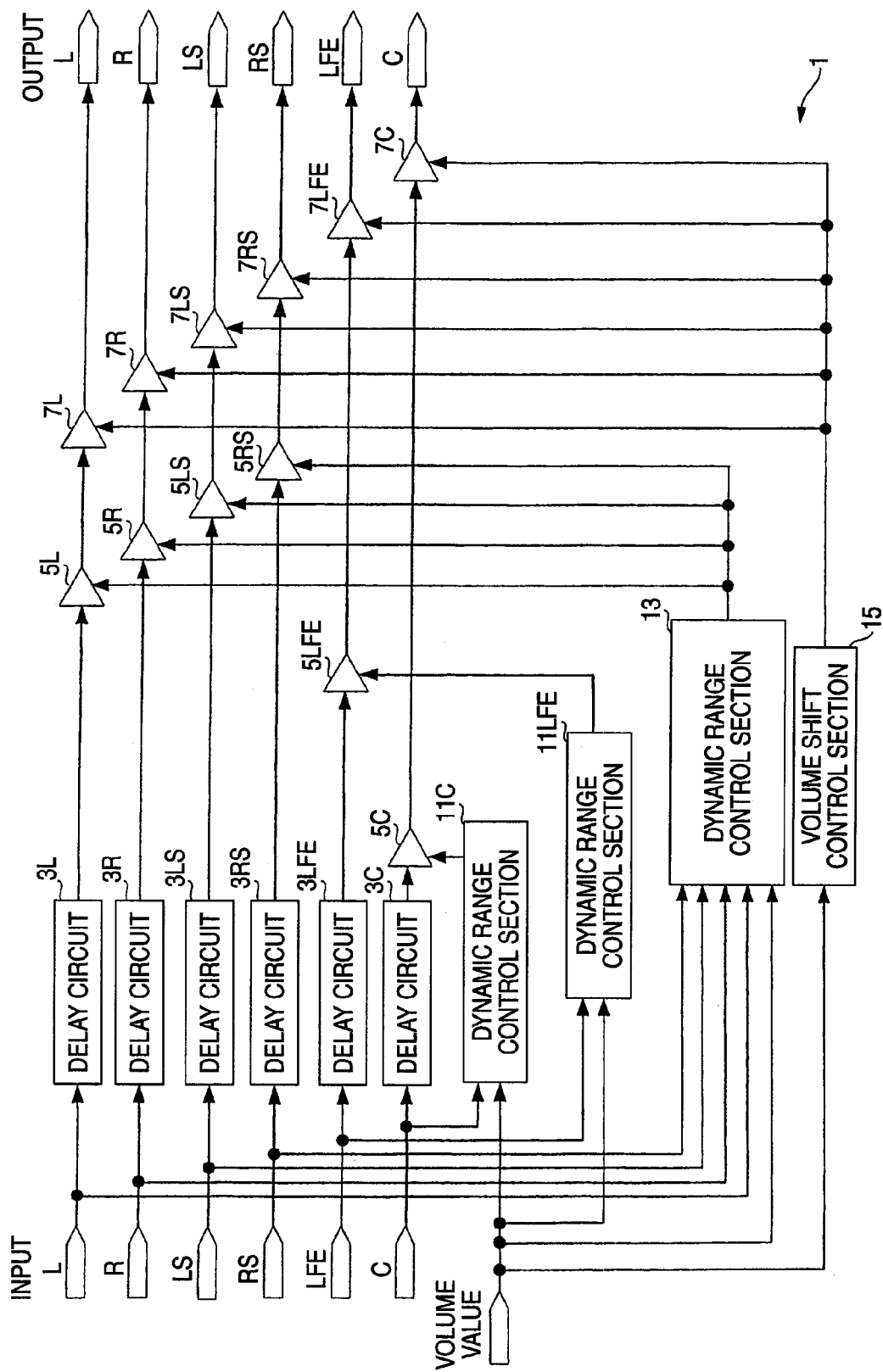
FIG. 1 is a block diagram showing the configuration of a sound volume controller.

FIG. 1 is a block diagram showing an example configuration achieved when the sound volume controller of this embodiment is applied to a multichannel format for 5.1 channels. The present invention is not limited to the 5.1 channels, and the configuration of the sound volume controller shown in FIG. 1 can be scaled up or down in accordance with the number of channels to be actually used.

The sound volume controller 1 has input lines for 5.1 channels, such as an L channel, an R channel, an LS (left surround) channel, an RS (Right surround) channel, a C (center) channel, and an LFE (Low-frequency effects) channel. When an input sound is an audio signal of a movie, the C channel primarily represents human voice, and the other channels represent music, sound effects, and the like. In this embodiment, all audio signals transmitted through the inside of the controller are assumed to be digital audio signals unless otherwise specified.

An audio signal of the L channel, an audio signal of the R channel, an audio signal of the LS channel, an audio signal of the RS channel, an audio signal of the C channel, and an audio signal of the LFE channel are input to delay circuits 3L, 3R, 3LS, 3RS, 3C, and 3LFE, respectively. The delay circuits 3L, 3R, 3LS, 3RS, 3C, and 3LFE delay the L channel audio signal, the R channel audio signal, the LS channel audio signal, the RS channel audio signal, the C channel audio signal, and the LFE channel audio signal, respectively. Delay operation is intended effect synchronization with processing of a dynamic range control section (see FIGS. 2 and 3) to be described later, to thus diminish an uncomfortable auditory feeling.

The audio signals delayed by the delay circuits 3L, 3R, 3LS, 3RS, 3C, and 3LFE are input to amplifiers 5L, 5R, 5LS, 5RS, 5C, and 5LFE, respectively. The amplifiers 5L, 5R, 5LS, 5RS, 5C, and 5LFE adjust variably amplify levels of the respective audio signals. A dynamic range control section 11C sets an amount of level adjustment of the amplifier 5C; a dynamic range control section 11LFE sets an amount of level adjustment of the amplifier 5LFE; and a dynamic range control section 13 sets amounts of level adjustment of the respective amplifiers 5L, 5R, 5LS, and 5RS. Audio signals having undergone level adjustment in the amplifiers 5L, 5R, 5LS, 5RS, 5C, and 5LFE are further subjected to level adjustment (volume shift) in amplifiers 7L, 7R, 7LS, 7RS, 7C, and 7LFE. Amounts of volume shift are set by a volume shift control section 15. Audio signals undergone a volume shift are output from L, R, LS, RS, C, and LFE output lines, respectively.

A C channel audio signal is input to the dynamic range control section 11C, and an LFE channel audio signal is input to the dynamic range control section 11LFE. Further, L, R, LS, and RS channel audio signals are input to the dynamic range control section 13. A volume value set by the user is input to the dynamic range control section 11C, the dynamic range control section 11LFE, the dynamic range control section 13, and the volume shift control section 15, respectively.

Figure 2A:
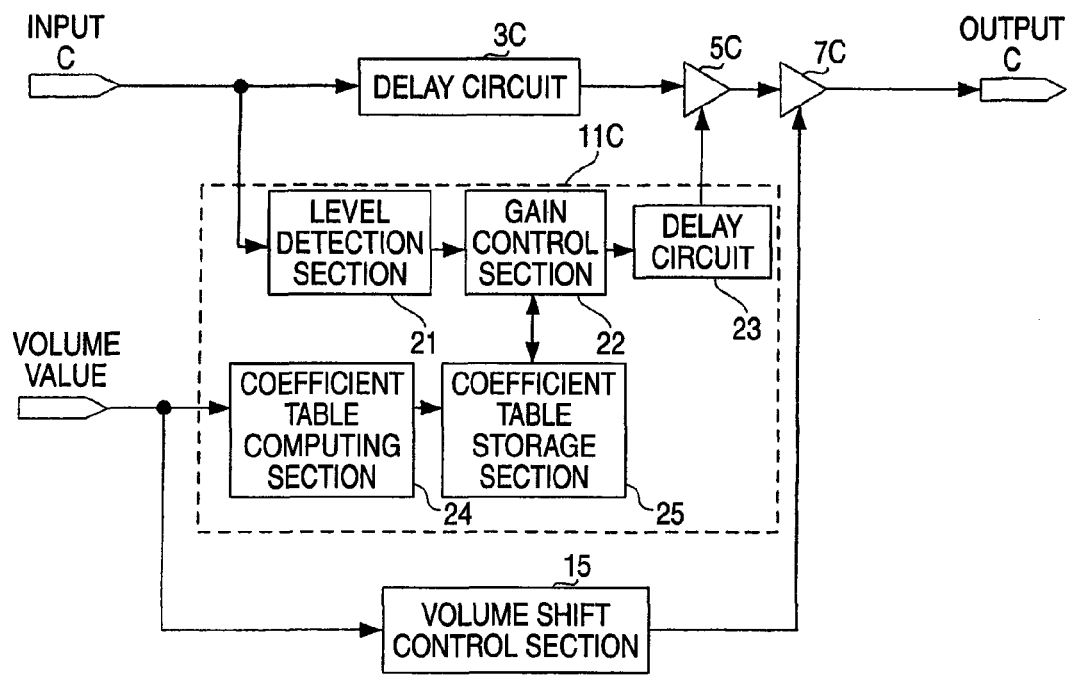
FIGS. 2A and 2B are block diagrams showing the configurations of dynamic range control sections 11C and 11LFE.

FIG. 2A is a block diagram showing the configuration of the dynamic range control section 11C (a C channel processing line). The dynamic range control section 11C has a level detection section 21, a gain control section 22, a delay circuit 23, a coefficient table computing section 24, and a coefficient table storage section 25.

Figure 2B:
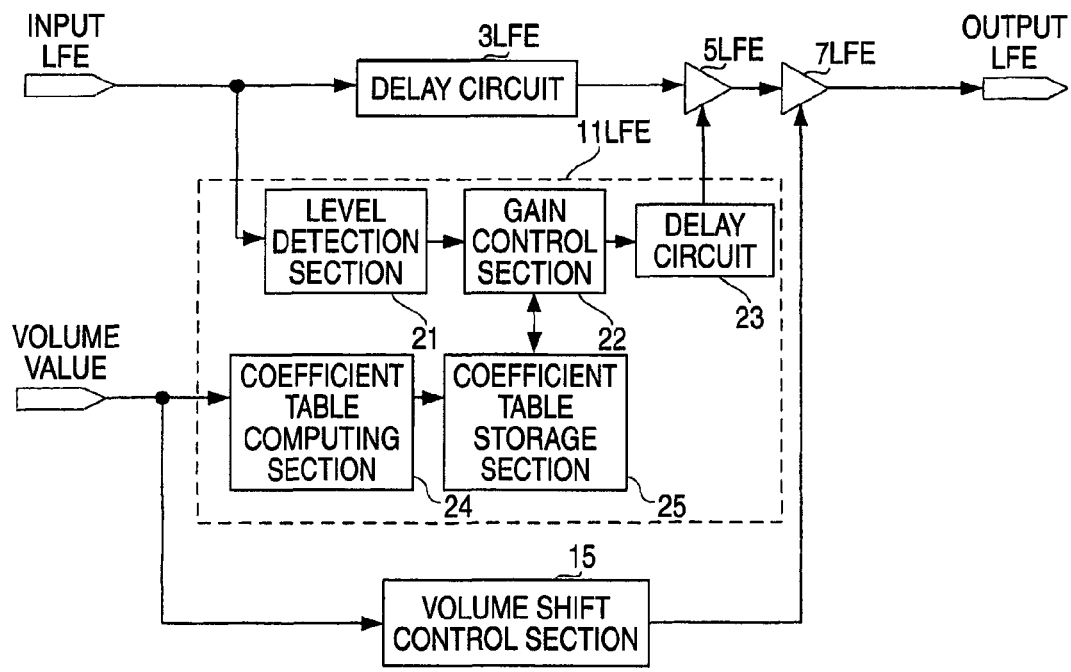

FIG. 2B is a block diagram showing the configuration of the dynamic range control section 11LFE (an LFE channel processing line). The dynamic range control section 11LFE has the same configuration and function as those of the dynamic range control section 11C shown in FIG. 2A. Therefore, respective constituent sections of the dynamic range control section 11LFE are assigned the same reference numerals as those used for the dynamic range control section 11C, and their explanations are omitted.

Figure 3:
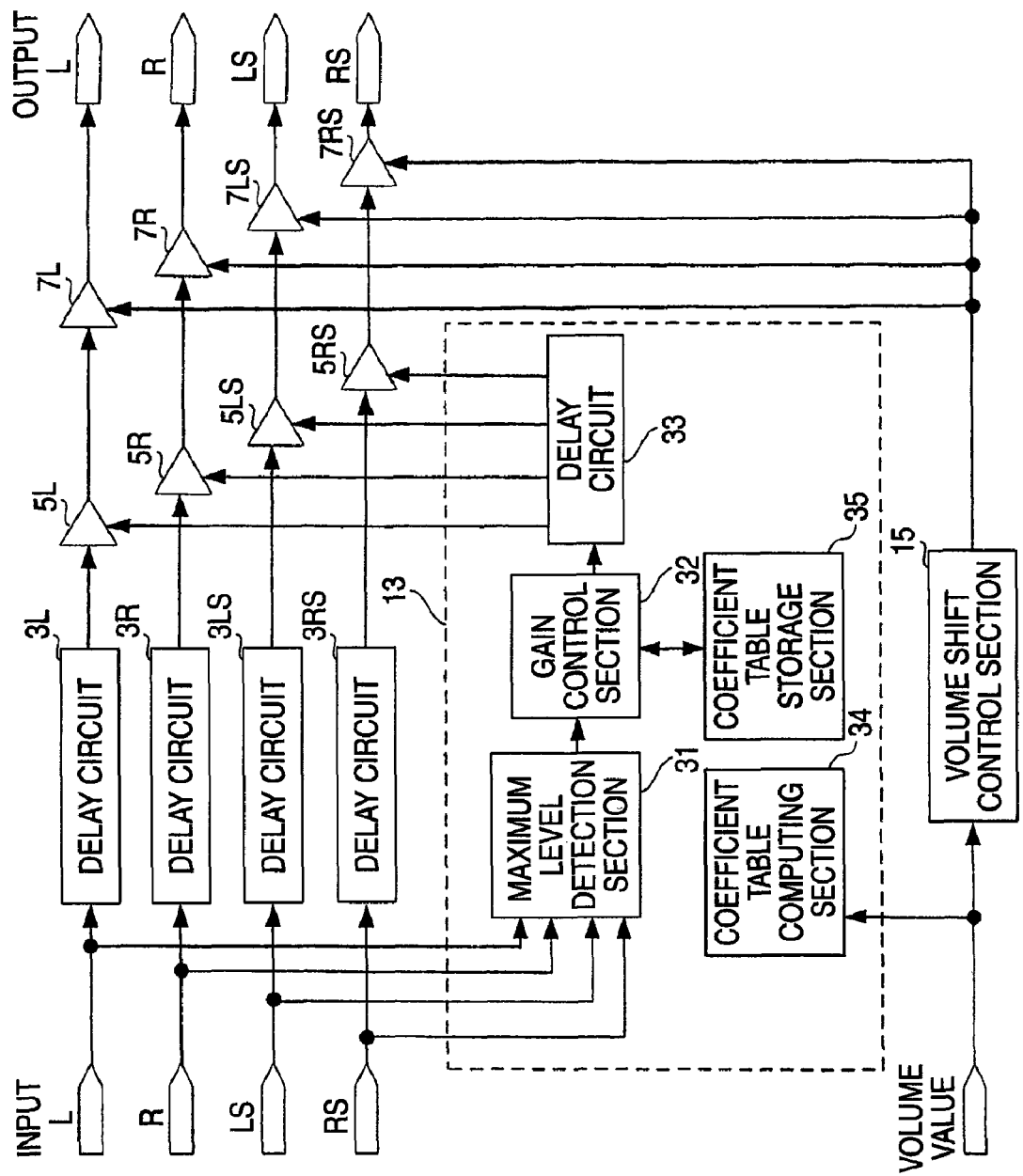
FIG. 3 is a block diagram showing the configuration of a dynamic range control section 13.

FIG. 3 is a block diagram showing the configuration of the dynamic range control section 13 (L, R, LS, and RS channel processing lines). The dynamic range control section 13 has a maximum level detection section 31, a gain control section 32, a delay circuit 33, a coefficient table computing section 34, and a coefficient table storage section 35.

In FIG. 2A, the level detection section 21 inputs a C channel audio signal and performs level detection. A detected level value is input to a gain control section 22. The gain control section 22 determines an amount of level adjustment of the amplifier 5C in accordance with the input level value. A dynamic range is compressed by setting the amount of level adjustment of the amplifier 5C. The gain control section 22 reads a coefficient for dynamic range compression from a coefficient table storage section 25; computes the level of an output in response to an input in accordance with the thus-read coefficient; and sets the amount of level adjustment of the amplifier 5C.

The coefficient for dynamic range compression stored in the coefficient table storage section 25 is altered in real time by the coefficient table computing section 24. The coefficient table computing section 24 inputs the volume value set by the user and computes a coefficient in accordance with the volume value.

Figure 4A:
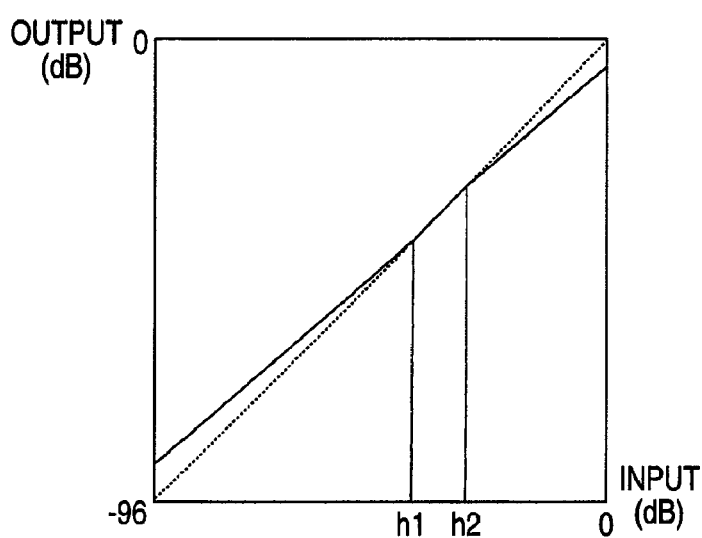
FIGS. 4A to 4C are views showing overviews of dynamic range compressions.
Figure 4B:
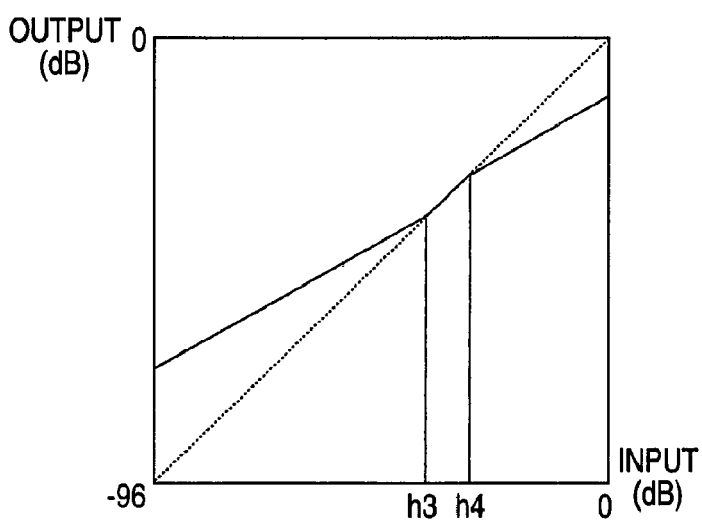
Figure 4C:
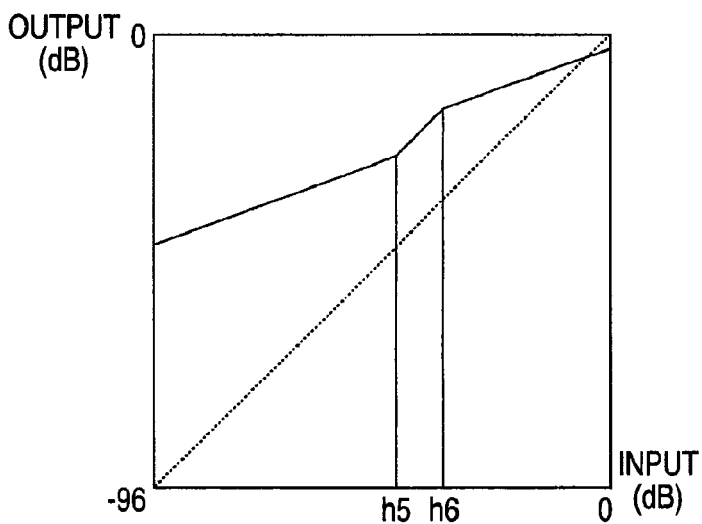

FIG. 4 is a view showing an overview of dynamic range compression. Horizontal axes of graphs shown in FIGS. 4A to 4C represent the level of an input (Input), and vertical axes of the graphs represent the level of an output (Output). Broken lines shown in FIGS. 4A to 4C show a case where dynamic range compression is not performed (a linear relationship exists between an input and an output). First, FIG. 4A is a view showing an overview of dynamic range compression performed when an input volume level is high (in the vicinity of; for instance, 0 dB). In the descriptions, a linear relationship is achieved in a range where the level of an input is between h1 and h2 (an intermediate area between −96 dB and 0 dB). In a range where the level of the input is h2 or more, the level of an output is reduced with an increase in the level of an input. In a range where the level of an input is less than h1, the level of an output is increased with a decrease in the level of an input. Therefore, the high volume level, such as sound effects, is reduced, and voice of a low volume value, such as whispers, is amplified.

A coefficient corresponding to the level of such an output responsive to the level of an input (the amount of level adjustment responsive to the level of an input) is stored as a coefficient table for each input level in a coefficient table storage section 25. The gain control section 22 reads an amount of level adjustment corresponding to a level of a received input by reference to the coefficient table, and sets the thus-read table in an amplifier 5C. Setting the amount of level adjustment of the gain control section 22 is delayed by the delay circuit 23. Since the delay circuit 23 adjusts a level by imparting a predetermined delay (e.g., 1 ms), a change in volume becomes mild, so that an uncomfortable auditory feeling can be lessened.

FIG. 4B is a view showing an overview of dynamic range compression achieved when an input volume level is in an approximate middle level (in the vicinity of; for example, −30 dB). In the embodiment, dynamic range compression shows a linear relationship in a range where the level of an input is between h3 and h4 (an intermediate range between −96 dB and 0 dB). A level of h3 may also be identical with or differ from a level of h1. Likewise, a level of h4 may also be identical with or differ from a level of h2.

In the range where the level of an input is h4 or more, the level of an output is reduced with an increase in the level of the input. In the range where the level of an input is less than h2, the level of an output is increased with a decrease in the level of the input. In the case of an embodiment shown in FIG. 4B, a suppression of the high level range is greater (the level of the output is low) than that achieved in the embodiment shown in FIG. 4A. Further, an enhancement of the low level range is large (the level of the output is high). Consequently, when compared with the embodiment shown in FIG. 4A, sound of a high volume, such as sound effects, is reduced to a low level, and voice of a low volume, such as whispers, is amplified greatly. Therefore, dynamic range compression becomes higher than that performed in the embodiment shown in FIG. 4A.

FIG. 4C is a view showing an overview of dynamic range compression performed when another input volume value is low (in the vicinity of; for example, −60 dB). In the embodiment, the level of the output is increased with a decrease in the level of the input in the range where the level of an input is less than h5. In a range between h5 and h6 (an intermediate range between −96 dB and 0 dB), an amount of change in input and an amount of change in output become proportional to each other, but a signal is output after slightly being amplified. In a range of h6 or more, the level of the output is decreased with an increase in the level of the input. A level of h5 may also be identical with or differ from the level of h1 and the level of h3. Likewise, a level of h6 may also be identical with or differ from the level of h2 and the level of h4.

In the embodiment shown in FIG. 4C, even when the level of an input is maximum (0 dB), the input is not substantially suppressed (the output is close to 0 dB). Specifically, in the embodiment shown in FIG. 4C, the level of a low volume range is increased much greater than in the embodiment shown in FIG. 4B, thereby achieving a characteristic of involving an increase in overall volume and preventing substantial suppression of sound of high volume. Therefore, in the embodiment shown in FIG. 4C, dynamic range compression becomes higher when compared with that performed in the embodiment shown in FIG. 4B.

As mentioned above, a coefficient of dynamic range compression is altered by the volume value set by the user. Changing the coefficient by means of a volume value is performed by the coefficient table computing section 24. For instance, when the volume value is less than −60 dB, a coefficient by means of which dynamic range compression, such as that shown in FIG. 4C, is performed is set in the coefficient table storage section 25. When the volume value is −60 dB to −30 dB, a coefficient by means of which dynamic range compression shown in FIG. 4B is performed is set. When the volume value is −30 dB or more, a coefficient by means of which dynamic range compression, such as that shown in FIG. 4A, is performed is set. When the volume value is increased to 0 dB or thereabouts, dynamic range compression may also not be performed (a linear characteristic is exhibited).

Figure 5A:
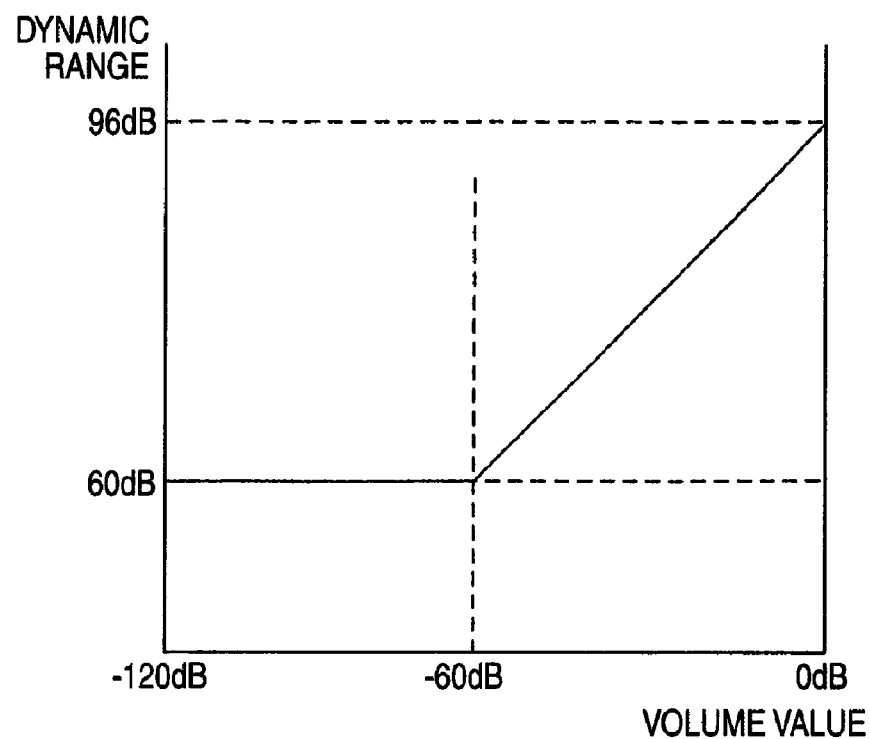
FIGS. 5A and 5B are views showing a relationship between a volume value and a dynamic range and a view showing a relationship between a volume value and a shift level.

Coefficients of dynamic range compression shown in FIGS. 4A to 4C are examples. In reality, the essential requirement is to change the coefficient, as required, in accordance with a change in volume value. FIG. 5A shows a view showing a relationship between a change in volume value and a dynamic range. A horizontal axis shown in FIG. 5A represents a volume value, and a vertical axis represents a dynamic range.

In the relationship shown in FIG. 4A, when the volume value is 0 dB, the dynamic range comes to 96 dB. Specifically, when the volume value is 0 dB, dynamic range compression is not performed (a relationship between an input and an output is made linear). When the volume value is −60 dB, the dynamic range comes to 60 dB and compressed. In a range from −60 dB to 0 dB, a change arises in such a way that the dynamic range decreases with a decrease in volume value and in proportion to a change in volume value. In a range where the volume value is less than −60 dB, no change arises in dynamic range in spite of an increase or decrease in volume value.

As mentioned above, the coefficient table computing section 24 changes the coefficient table stored in the coefficient table storage section 25 in such a way that the dynamic range changes in proportion to a change in volume value within a range where the volume value is from −60 dB to 0 dB.

Figure 7:
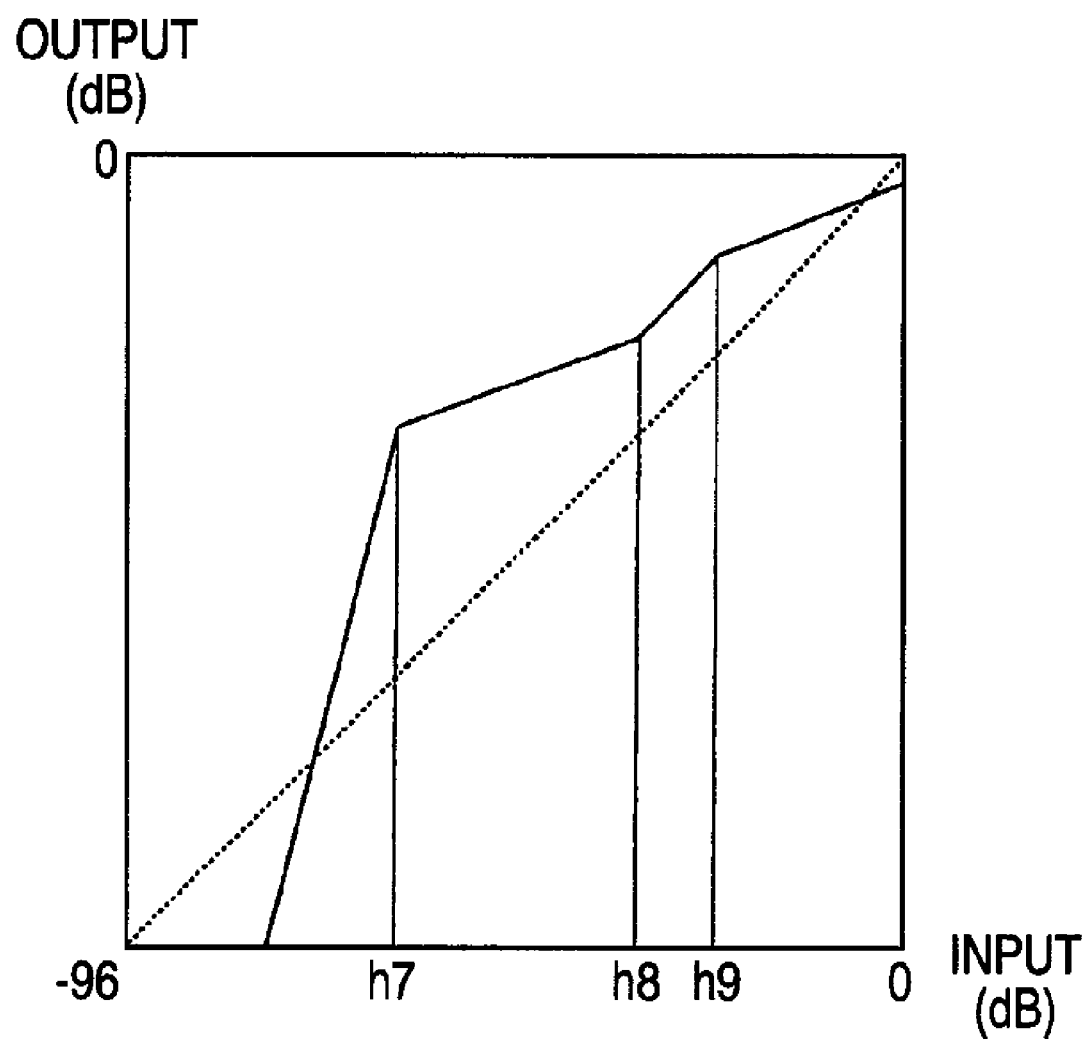
FIG. 7 is a view showing another example coefficient of dynamic range compression.

Dynamic range compression, such as that shown in FIG. 7, may also be performed. FIG. 7 is a view showing another example coefficient of dynamic range compression. The example of dynamic range compression shown in FIG. 7 is an example application of dynamic range compression shown in FIG. 4C. In the graph shown in FIG. 7, the level of an output is reduced with an increase in the level of an input in the range where the level of the input is h9 or more. In a range from h8 to h9, an amount of change in input and an amount of change in output are proportional to each other, and an output is produced after being slightly amplified. In a range from h7 to h8, the level of the output is increased with a decrease in the level of the input. In a range where the level of the input is less than h7, the level of the output is reduced with a decrease in the level of the input. As mentioned above, in a range where the level of the input is less than h7 (in a range where a volume of the input is very low), unwanted sound components (noise) are larger in amount than required sound, such as words. If the level of the output is increased, the noise will grate on. For this reason, in the range of less than h7, the level of the output is reduced, to thus eliminate noise. In the embodiment shown in FIG. 7, the dynamic range is expanded when compared with that achieved in the embodiment shown in FIG. 4C. However, the increase in dynamic range is intended for eliminating noise, and a required sound, such as words, is increased as in the embodiment shown in FIG. 4C.

By means of such a configuration, when the user decreases the volume value, dynamic range compression becomes higher. When the user increases the volume value, dynamic range compression becomes lower. Therefore, even when the user decreases the volume value, a required sound does not become too small, so that sound control suitable for viewing a movie, or the like, can be practiced. Further, the user does not need to activate or deactivate dynamic range compression, and sound control reflecting the user's viewing environment can be performed in real time because the coefficient of dynamic range compression is changed in accordance with the volume value.

Figure 6:
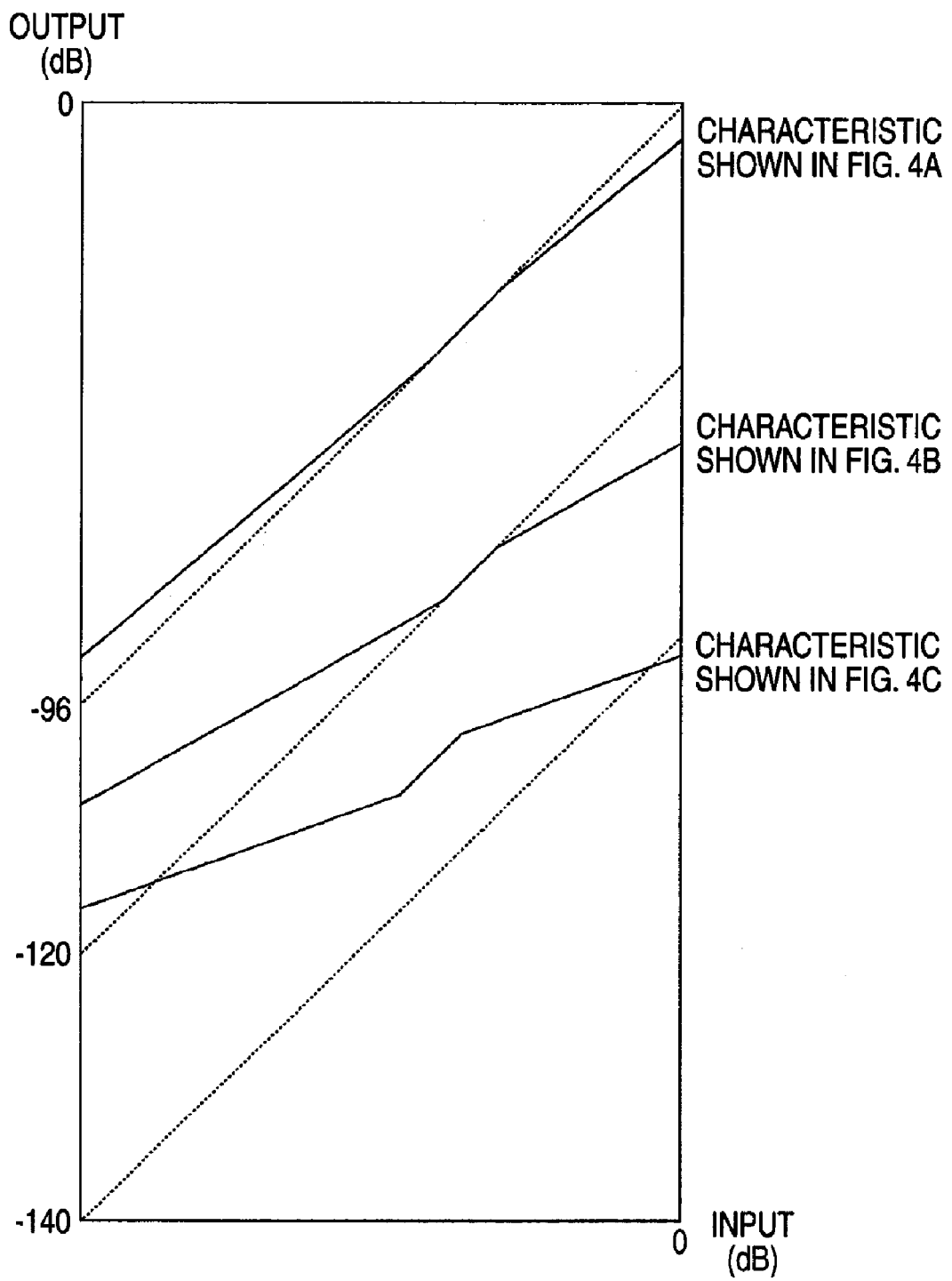
FIG. 6 is a view showing an overview of input/output gain characteristics achieved at a final stage when dynamic range compression of the present invention is performed.

The embodiments shown in FIGS. 4A to 4C correspond to illustrations intended for showing the concept of dynamic range compression, and do not show the level of an actually-output audio signal. In reality, an output audio signal (the level of a signal output to a speaker) is amplified, as an analogue audio signal, at an output in the final stage by a power amplifier in accordance with the volume value set by the user. Therefore, an actual output level totally differs from each other in FIGS. 4A to 4C, respectively. FIG. 6 is a view showing an overview of an input/output gain characteristic achieved in the final stage when dynamic range compression of the present invention is practiced. As indicated by a graph shown in; for example, FIG. 6, the levels of audio signals output in the final stage are plotted at the same scale; the level achieved in the embodiment shown in FIG. 4A becomes maximum; and the level achieved in the embodiment shown in FIG. 4C becomes minimum.

Figure 5B:
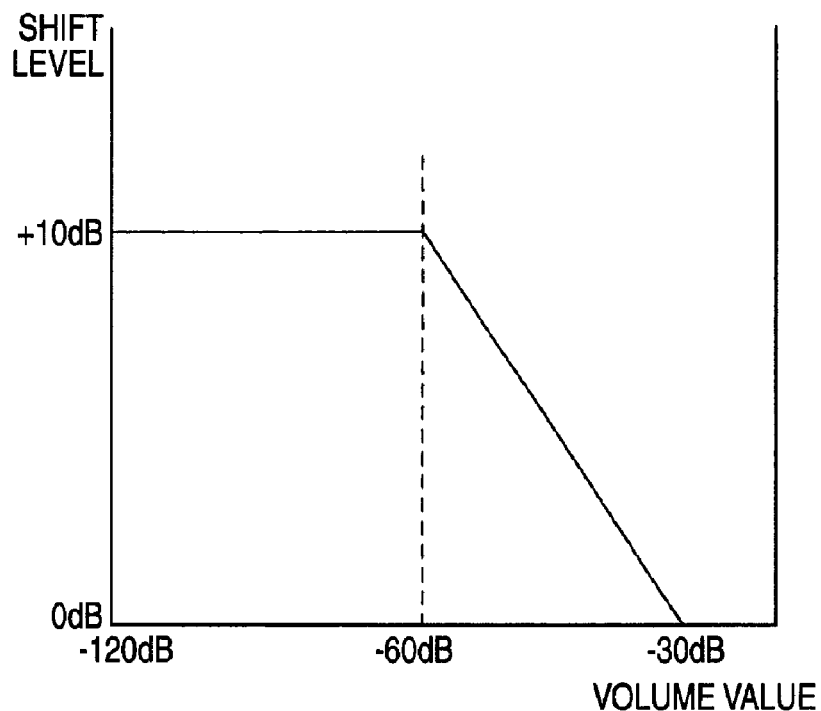

In FIG. 2A, a volume value set by the user is input to the volume shift control section 15. In accordance with the volume value, the volume shift control section 15 sets a sound shift level of the amplifier 7C. The volume shift is for eliminating an uncomfortable auditory feeling by slightly adjusting (increasing) the volume when the volume value becomes smaller. FIG. 5B is a view showing a relationship between a volume value and an amount of volume shift. As shown in; for example, FIG. 5B, in a range where the volume value ranges from −30 dB to −60 dB, an amount of volume shift increases with a decrease in volume value and in proportion to the volume value. When the volume value is −60 dB, the amount of volume shift is set to +10 dB. In a range of less than −60 dB, the amount of volume shift is fixed to +10 dB even when the volume value is decreased. When the volume value is too small, noise components become great, and hence volume shift is not performed greater than necessary.

The sound volume controller of this embodiment performs dynamic range compression and volume shift control, such as those mentioned above, for each channel. In FIG. 2B, in the dynamic range control section 11LFE, an audio signal of the LFE channel is input to level detection circuit 21, and the gain control section 22 reads a coefficient of dynamic range compression in accordance with the level of an input of the LFE channel. The coefficient is updated in accordance with the volume value set by the user. The gain control section 22 sets the amount of level adjustment of the amplifier 5LFE in accordance with the thus-read coefficient. Therefore, even in the LFE channel, dynamic range compression conforming to the volume value set by the user is performed. Further, even the amplifier 7LFE performs volume shift in accordance with the volume value.

In FIG. 3, the maximum level detection section 31 of the dynamic range control section 13 inputs an audio signal of the L channel, an audio signal of the R channel, an audio signal of the LS channel, and an audio signal of the RS channel, and detects the highest level (maximum level) of these audio signals. A value of the thus-detected maximum level is input to the gain control section 32. In accordance with the input level value, the gain control section 32 sets amounts of level adjustment of the amplifiers 5L, 5R, 5LS, and 5RS. Dynamic range compression is performed by setting the amounts of level adjustment of the amplifiers 5L, 5R, 5LS, and 5RS. The gain control section 32 reads the coefficient of dynamic range compression from the coefficient table storage section 35 and sets the amount of level adjustment.

The coefficient of dynamic range compression stored in the coefficient able storage section 35 is changed in real time by means of the coefficient table computing section 34. The coefficient table computing section 34 computes a coefficient in accordance with the volume value set by the user. A coefficient computing technique employed by the coefficient table computing section 34 is the same as that employed in the embodiments shown in FIGS. 4 and 5. While taking, as a reference, the channel of the highest-level audio signal among the audio signal of L channel, the audio signal of R channel, the audio signal of LS channel, and the audio signal of RS channel, the dynamic range control section 13 performs dynamic range compression in accordance with the level of the input of the channel. In relation to the L, R, LS, and RS channels primarily including sound effects, and the like, dynamic range compression is carried out by means of taking the channel of the highest level as a reference. Hence, a sound, such as sound effects, tends to be entirely suppressed, and unwanted increase in sound is prevented. Therefore, sound of the C channel is not lost in sound effects. Further, coefficients for dynamic range compression are collectively read and processed in connection with signals of a plurality of channels, and therefore processing load can be lessened.

As mentioned above, dynamic range compression of the C channel, dynamic range compression of the LFE channel, and dynamic range compression of another channel are performed by means of different lines, so that a sound, such as whispers, can be clearly heard without being lost in sound effects, and the like.

The present application is based on Japan Patent Application No. 2007-150265 filed on Jun. 6, 2008, the contents of which are incorporated herein for reference.

What is claimed is:

1. A sound volume controller, comprising:
    a level adjustment section that adjusts a level of an input audio signal and outputs the adjusted input audio signal as an output audio signal;
    a level detection section that detects the level of the input audio signal;
    a volume value detection section that detects a volume value set by a user;
    a coefficient table storage section that stores a coefficient table which describes a relation between levels of the output audio signal and levels of the input audio signal;
    a coefficient table change section that changes a coefficient of the coefficient table stored in the coefficient table storage section in accordance with the volume value detected by the volume value detection section;
    a setting section that sets an amount of level adjustment of the level adjustment section in accordance with the level of the input audio signal detected by the level detection section and the coefficient table;
    wherein the coefficient table includes a linear range in which an amount of change in the level of the input audio signal is same as an amount of change in the level of the output audio signal, a small range which is smaller than the linear range in the level of the input audio signal, and a large range which is larger than the linear range in the level of the input audio signal;

wherein the small range and large range are compression ranges in which the amount of change in the level of the output audio signal is smaller than the amount of change in the level of the input audio signal;

wherein the coefficient table change section changes the coefficient of the coefficient table so that a ratio of the amount of change in the level of the output audio signal to the amount of change in the level of the input audio signal in the compression ranges becomes small in accordance with a decrease of the volume value.

2. The sound volume controller according to claim 1, further comprising:

a volume shift section that adjusts a level of the output audio signal output from the level adjustment section; and a volume shift control section that sets volume shift level of the volume shift section in accordance with the volume value detected by the volume value detection section.

3. The sound volume controller according to claim 1, wherein the input audio signal is formed from signals of a plurality of channels;

wherein the level adjustment section adjusts respective levels of the signals of the plurality of channels;

wherein the level detection section detects the respective levels of the signals of the plurality of channels; and wherein the setting section sets amounts of level adjustment of the channels respectively in accordance with the respective levels of the signals of the plurality of channels.

4. The sound volume controller according to claim 3, wherein the level detection section detects a level of an input audio signal of a channel having the maximum level among the signals except a signal of a specific channel; and wherein the setting section sets amounts of level adjustment for the channels except the specific channel in accordance with the level of the input audio signal having the maximum level.

5. The sound volume controller according to claim 4, wherein the signals except the signal of the specific channel are an audio signal of an L channel, an audio signal of an R channel, an audio signal of an LS channel, and an audio signal of an RS channel.

* * * * *